(12) United States Patent
Frank et al.

(10) Patent No.: US 7,488,630 B2
(45) Date of Patent: Feb. 10, 2009

(54) METHOD FOR PREPARING 2-DIMENSIONAL SEMICONDUCTOR DEVICES FOR INTEGRATION IN A THIRD DIMENSION

(75) Inventors: David J. Frank, Yorktown Heights, NY (US); Douglas C. La Tulipe, Jr., New Fairfield, CT (US); Leathen Shi, Yorktown Heights, NY (US); Steven E. Steen, Peekskill, NY (US); Anna W. Topol, Jefferson Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 52 days.

(21) Appl. No.: 11/682,638

(22) Filed: Mar. 6, 2007

(65) Prior Publication Data

US 2008/0217782 A1     Sep. 11, 2008

(51) Int. Cl.
*H01L 29/74* (2006.01)
*H01L 31/111* (2006.01)

(52) U.S. Cl. .................. 438/149; 438/152; 438/239; 257/347

(58) Field of Classification Search .............. 438/149, 438/152–155, 239; 257/347
See application file for complete search history.

(56) References Cited

U.S. PATENT DOCUMENTS 6,355,501 B1    3/2002  Fung et al.
6,500,724 B1 *  12/2002 Zurcher et al. ............. 438/384
6,645,796 B2 *  11/2003 Christensen et al. ........ 438/149

FOREIGN PATENT DOCUMENTS

WO    WO-2006/077441 A1    7/2006

OTHER PUBLICATIONS

Fleischmann, R.M. et al. (2004). "Considerations With the Use of Biological Therapy in the Treatment of Rheumatoid Arthritis," *Expert. Opin. Drug Safety* 3(5):391-403.
International Search Report for PCT Application No. PCT/US2006/013921 filed Apr. 11, 2006, mailed Jan. 2, 2007, seven pages.
Lane, N. et al. (Sep. 2005). "RN624 (Anti-NGF) Improves Pain and Function in Subjects with Moderate Knee Osteoarthritis: A Phase I Study," *Arthritis & Rheumatism* 52(9-Suppl. S):S461, Abstract No. 1205.

(Continued)

*Primary Examiner*—Theresa T Doan
(74) *Attorney, Agent, or Firm*—Scully, Scott, Murphy & Presser, P.C.; Ido Tuchman, Esq.

(57) ABSTRACT

A method which is intended to facilitate and/or simplify the process of fabricating interlayer vias by selective modification of the FEOL film stack on a transfer wafer is provided. Specifically, the present invention provides a method in which two dimensional devices are prepared for subsequent integration in a third dimension at the transition between normal FEOL processes by using an existing interlayer contact mask to define regions in which layers of undesirable dielectrics and metal are selectively removed and refilled with a middle-of-the-line (MOL) compatible dielectric film. As presented, the inventive method is compatible with standard FEOL/MOL integration schemes, and it guarantees a homogeneous dielectric film stack specifically in areas where interlayer contacts are to be formed, thus allowing the option of a straightforward integration path, if desired.

13 Claims, 4 Drawing Sheets

OTHER PUBLICATIONS

Orbach, H. et al. (Dec. 2005). "Intravenous Immunoglobulin: Adverse Effects and Safe Aministration," *Clinical Rev. Allergy Immunol.* 29(3):173-184, (Abstract Only,) one page.

Seaver, S.S. (Aug. 1994). "Monoclonal Antibodies in Industry: More Difficult Than Originally Thought," *Genetic Engineering* 14(14):10, 21.

Shelton, D.L. et al. (Jul. 2005). "Nerve Growth Factor Mediates Hyperalgesia and Cachexia in Auto-Immune Arthritis," *Pain* 116(1-2):8-16.

Stedman, T.L. (2000). "Definition of Osteoarthritis" In *Illustrated Stedman's Medical Dictionary*, Lippincott Williams & Wilkins: Baltimore, MD, 27th Edition, p. 1282.

Suntharalingam, G. et al. (Sep. 7, 2006). "Cytokine Storm in a Phase 1 Trial of the Anti-CD28 Monoclonal Antibody TGN1412," *New England Journal of Medicine* 355(10):1018-1029.

Vastag, B. (Jun. 2006). "Monoclonals Expand into Neural Disorders," *Nature Biotechnology* 24(6):595-596.

* cited by examiner

METHOD FOR PREPARING 2-DIMENSIONAL SEMICONDUCTOR DEVICES FOR INTEGRATION IN A THIRD DIMENSION

This invention was made with U.S. Government support under Contract No. 66001-04-C-8032 awarded by the Defense Advanced Research Projects Agency (DARPA). As such, the U.S. Government has certain rights to this invention.

FIELD OF THE INVENTION

The present invention relates to semiconductor device fabrication, and more particularly to a method that allows for preparing two-dimensional (2D) semiconductor devices for integration in a third dimension using the same mask set. The present invention also relates to semiconductor structures that are prepared by the inventive method.

BACKGROUND OF THE INVENTION

Three-dimensional integrated semiconductor structures have been investigated as an approach for improving the performance of a semiconductor product. Density can be upgraded many fold by stacking chips or wafers on top of each other. Significant speed improvement can also be expected because the interconnecting wires linking the vertically stacked wafers or chips are shortened substantially.

The application of three-dimensional (3D) integration techniques to wafer level bonding of front-end-of-the line (FEOL) devices requires devices or circuits to be aligned and bonded to a companion device wafer and that high aspect ratio (height to width ratio of greater than 3.0) metal interconnecting structures, e.g., interlayer vias, be formed through the bonded interface to connect to the FEOL devices.

As such, the prior art 3D integration techniques are quite complicated involving numerous processing steps. Moreover, in prior art 3D integration, the etching of the interlayer via openings must be compatible with multiple materials to open contacts in the integrated structure.

It is well known in the semiconductor art that structures referred to as "CMP fill" must be included in device fabrication designs in order to guarantee uniform thinning via chemical mechanical polishing (CMP), as well as, to provide interlevel structural support in FEOL and back-end-of-the-line (BEOL) integration schemes. The CMP fill structures are checkerboard array of boxes which fill open areas between semiconductor devices. CMP fill structures typically consist of a material stack that contains different types of materials. For example, a CMP fill structure may consist of combinations of polysilicon (polySi) and metal silicide in the FEOL, and Cu metal in the BEOL.

These CMP fill structures as well as multiple layers of dielectrics and metallurgy such as, for example SOI islands, silicon nitrides, silicides, etc, can impose complicated processing schemes, or even barriers to the formation of interlayer contacts required for 3D integration of FEOL structures.

In view of the above, there is a continued need for a method that can selectively prepare 2D semiconductor devices (or structures) for subsequent 3D integration in which the above-mentioned problems can be avoided. In particular, a method is needed for preparing 2D semiconductor devices for future 3D integration that avoids multiple masks and specialized etching processes.

SUMMARY OF THE INVENTION

The present invention provides a proactive method which is intended to facilitate and/or simplify the process of fabricating interlayer vias by selective modification of the FEOL film stack on a transfer wafer. Specifically, the present invention provides a method in which a 2D semiconductor device (or structure) is prepared for a 3D integration scheme at the transition between normal FEOL processes by using an existing interlayer contact mask to define regions in which layers of undesirable dielectrics and metal are selectively removed and refilled with a middle-of-the-line (MOL) compatible dielectric film. The inventive method is compatible with standard FEOL/MOL integration schemes, and it guarantees a homogeneous dielectric film stack specifically in areas where interlayer contacts are to be formed, thus allowing the option of a straightforward integration path, if desired.

In particular, the present invention provides a method (i.e., a process integration scheme) that allows the fabrication of 2D semiconductor devices for integration in a third dimension using the same mask set without the need of utilizing any specialized etching processes. The inventive method minimizes the requirements imposed on lithography and etching processing by conventional 3D integration. Moreover, the inventive method also allows flexibility in manufacturing part number inventory.

Generally, the inventive method entails the selective removal of portions of a FEOL CMP fill stopping below a surface of a semiconductor substrate. Typically, the selective removal process employed in the present invention uses the buried insulating layer of an SOI substrate or a trench isolation region as an etch stop layer. The selective removal creates openings (interlayer via openings) which are then refilled with a dielectric material. The interlayer via openings are then extended by etching through the substrate in a self-aligned manner. The etching stops on an upper surface of another structure that is bonded to the bottom most surface of the structure including the SOI substrate and material stack. The advantage of the present invention is that it does not require specialized photomasks and it simplifies the BEOL connecting via etch process.

Moreover, the present invention provides a method for forming an interlayer contact via through a semiconductor substrate (e.g., wafer) at the device level such that a single mask set can be used to define the contact openings and a single etch can be used to etch through the wafer.

In general terms, the method of the present invention comprises:

providing a first structure including at least one material stack on a semiconductor substrate, said semiconductor substrate including at least a buried insulating layer;

forming a dielectric liner covering said at least one material stack and said semiconductor substrate;

forming at least one via opening in said first structure which extends below the surface of said semiconductor substrate using said dielectric liner as an etch mask, and said buried insulating layer as an etch stop layer;

providing a planarized dielectric material which fills said at least one via opening and extends above said at least one material stack;

bonding a second structure including at least one semiconductor device to a surface of said semiconductor substrate that is opposite a surface of said first structure including said at least one material stack;

selectively etching preselected areas of said planarized dielectric material which are located above and within said at least one interlayer via opening to extend said at least one interlayer via opening stopping on an upper surface of said second structure; and filling said extended at least one interlayer via opening with a conductive material.

In some embodiments of the present invention, a spacer is formed within the at least one interlayer via opening to reduce the width of the via. In addition, the spacer provides physical and electrical isolation of the interlayer via openings to the surrounding material stacks. The spacer is used in embodiments wherein the at least one interlayer via opening has an aspect ratio that is about 3:1 or less. When the aspect ratio of the at least one interlayer via opening is greater than 3:1, spacer formation is typically not needed. In embodiments in which a spacer is employed, the extended interlayer via opening has sidewalls that are aligned to outer edges of the spacer. When the spacer is not present, the extended interlayer via opening has sidewalls that are aligned to etched wall portions of the at least one material stack and/or the etched dielectric liner.

In the present invention, the second structure that is bonded to the first structure includes at least one semiconductor device, e.g., FET, capacitor, bipolar transistor, diode and/or circuit element. The second structure typically includes an interconnect structure that comprises at least one interlayer dielectric that includes at least one conductive feature (i.e., via, line or combined via and line). The interconnect structure is located above said at least one semiconductor device.

In one preferred embodiment of the present invention, the method comprises:

providing a first structure including at least one material stack comprising, from bottom to top, polySi, and a metal silicide on a patterned SOI layer of a semiconductor-on-insulator (SOI) substrate;

forming a silicon nitride liner covering said at least one material stack and said SOI substrate;

forming at least one interlayer via opening in said first structure utilizing a buried oxide layer of said SOI substrate as an etch stop layer and said silicon nitride liner as an etch mask;

providing a planarized dielectric material which fills said at least one interlayer via opening and extends above said at least one material stack;

bonding a second structure including at least one semiconductor device to a surface a surface of said SOI substrate that is opposite a surface including said at least one material stack;

selectively etching preselected areas of said planarized dielectric material which are located above and within said at least one interlayer via opening to extend said at least one interlayer via opening through said SOI substrate stopping on an upper surface of said second structure; and filling said extended at least one interlayer via opening with a conductive material.

In addition to providing a method, the present invention also relates to a semiconductor structure that is formed utilizing the same. In general terms, the semiconductor structure of the present application comprises:

a semiconductor substrate including at least one material stack located on a surface thereof;

a patterned dielectric liner located at least on portions of said at least one material stack and said semiconductor substrate;

a planarized dielectric material located on an upper surface of said patterned dielectric liner; and at least one conductively filled interlayer via opening having an aspect ratio of greater than 3:1 located within said planarized dielectric material that extends through said patterned dielectric liner to an upper surface of a bonded structure including at least one semiconductor device, said bonded structure is located on a surface of said semiconductor structure that is opposite said at least one material stack.

DETAILED DESCRIPTION OF THE INVENTION

The present invention, which provides a method of preparing 2D semiconductor devices for subsequent integration in a third dimension as well as the structure that is formed utilizing the inventive method, will now be described in greater detail by referring to the following discussion and drawings that accompany the present application. It is noted that the drawings of the present application are provided for illustrative purposes and, as such, the drawings are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

As stated above, the present invention provides a method (i.e., a process integration scheme) that allows for preparing a 2D structure for integrating in a third dimension utilizing the same mask set without the need of utilizing any specialized etching processes. The inventive method minimizes the requirements imposed on lithography and etching processing by 3D integration. The inventive method also allows the flexibility in manufacturing part number inventory.

Reference is now made to FIGS. 1-6 which illustrate the basic processing steps that are employed in the present invention. The inventive method begins by first providing the structure 10 shown in FIG. 1 which includes a semiconductor substrate 12 having at least one material stack 14 which is located on a surface of a patterned SOI layer 12C of said substrate. The structure 10 is made utilizing conventional complementary metal oxide semiconductor (CMOS) processing steps that are well known to those skilled in the art. It is noted that the FEOL devices such as field effect transistors are located to the periphery of the region of the semiconductor structure 10 shown in FIG. 1. In order not to obscure the present invention, the details of CMOS processing have been omitted herein.

Figure 1:
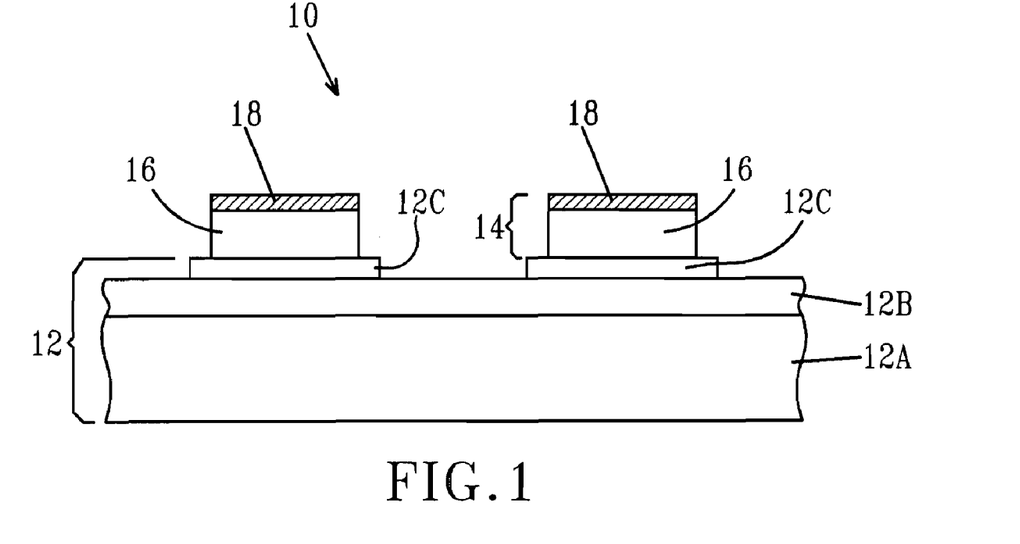
FIGS. 1-6 are pictorial representations (through cross sectional views) illustrating the inventive method of the present application.

The semiconductor substrate 12 of the structure 10 shown in FIG. 1 comprises a semiconductor-on-insulator (SOI) substrate, which includes a top semiconductor layer (herein after labeled as 12C) and a bulk semiconductor wafer 12A that are separated at least in part by a buried insulating layer 112B. In some embodiments, the SOI substrate is replaced with a bulk semiconductor material and the material stack 14 is formed atop a trench isolation region. The buried insulating layer 12B includes, for example, a crystalline or non-crystalline oxide, nitride or any combination thereof Preferably, the buried insulating layer 12B is an oxide. Typically, the buried insulating layer 12B is formed during initial stages of a layer transfer process or during an ion implantation and annealing process, such as, for example, SIMOX (separation by ion implantation of oxygen). The bottom semiconductor layer of the initial SOI substrate may be present (not shown) or it can be removed by back-side planarization after FEOL processing. FIG. 1 illustrates an embodiment in which the bottom semiconductor layer of the initial SOI substrate has been removed prior to bonding to wafer 12A.

The top semiconductor layer 12C, the bottom semiconductor layer and the bulk semiconductor wafer may comprise the same or different semiconducting material including, for example, Si, SiC, SiGeC, Ge, SiGe, Ga, GaAs, InAs, InP as well as other III/V or II/VI compound semiconductors. Layered semiconductors such as, for example, Si/SiGe are also contemplated herein. Typically, the semiconductor substrate 12 is a Si-containing semiconductor such as, for example, Si, SiC, SiGe or SiGeC. The substrate 12 may be unstrained, strained or include regions of strain and unstrain therein. The substrate 12 may be intrinsic or it may be doped with, for example, but not limited to: B, As or P.

The top semiconductor layer (hereinafter the SOI layer) and the bottom semiconductor layer of the initial SOI substrate may have a single crystal orientation or alternatively hybrid semiconductor substrates having surface regions of different crystal orientations can also be employed. The hybrid substrate allows for fabricating a FET upon a specific crystal orientation that enhances the performance of each FET formed. For example, the hybrid substrate allows for providing a structure in which a pFET can be formed on a (110) crystal orientation, while the nFET can be formed on a (100) crystal orientation. When a hybrid substrate is used, it may have SOI-like properties, bulk-like properties or a combination of SOI- and bulk-like properties.

In some embodiments of the present invention, at least one isolation region (not shown) is formed into the substrate 12. In embodiments in which isolation regions are present, the at least one material stack 14 including the FEOL CMP fill may be located directly above the isolation region. The at least one isolation region may include a trench isolation region, a field oxide isolation region or combinations thereof. The isolation regions are formed utilizing processing techniques well known to those skilled in the art.

During the CMOS process a top portion of the semiconductor substrate, i.e., the top Si-containing layer, can be etched to form a patterned SOI layer 12C as is shown in FIG. 1. The at least one material stack 14 is located on a surface of said patterned SOI layer 12C.

The at least one material stack 14 including the CMP fill is formed during the process of creating semiconductor devices with standard deposition, silicidation, lithography and etching techniques. As is known to those skilled in the art a "CMP fill" must be included in device fabrication designs in order to guarantee uniform thinning via CMP (i.e., chemical mechanical polishing), as well as, to provide interlevel structural support in FEOL and back-end-of-the-line (BEOL) integration schemes. The CMP fill structures are checkerboard array of boxes which fill open areas between devices. The CMP structures typically consists of a material stack that contains different types of materials, For example, a CMP structure may consist of combinations of polysilicon and metal silicide in the FEOL, and Cu metal in the BEOL. These structures as well as multiple layers of dielectrics and metallurgy such as, for example SOI islands, nitrides, and silicides can impose complicated process schemes, or even barrier to the formation of interlayer contacts required for 3D integration of FEOL structures.

In the particular embodiment shown, the at least one material stack 14 includes, from bottom to top, polysilicon 16 and a metal semiconductor alloy (e.g., a metal silicide) 18. The metal semiconductor alloy includes a metal such as, for example, W, Ti, Ta, Ni, Co and Pt, which is capable of reacting with a semiconductor material to form the metal semiconductor alloy. Other metals which are capable of reacting with a semiconductor (such as silicon) to form a metal semiconductor alloy (such as a metal silicide) are also contemplated in the present application. Alloys including at least one of the aforementioned metals are also contemplated for use as the metal semiconductor alloy layer 18.

Figure 2:
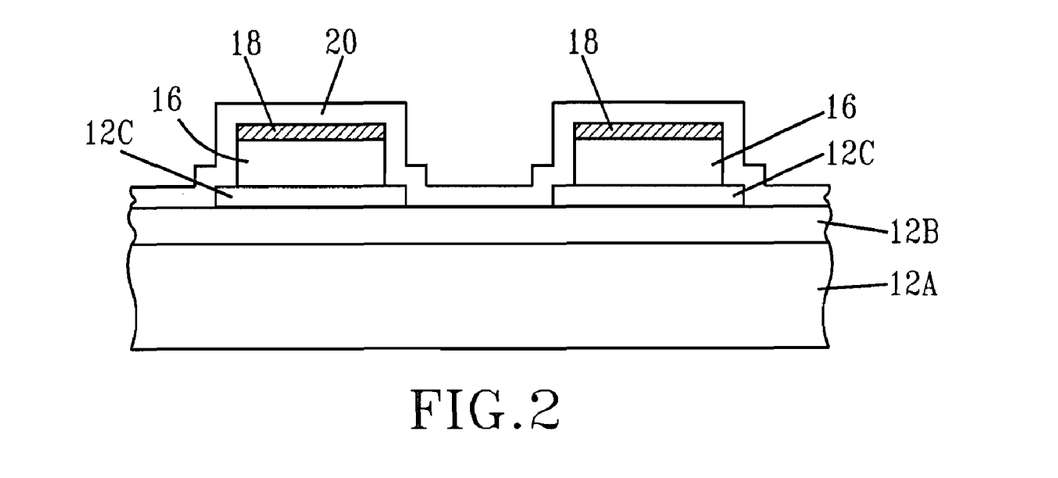

After providing the structure 10 shown in FIG. 1, a dielectric liner 20 is formed which covers the at least one material stack 14 and exposed surfaces of the semiconductor substrate 12, including the patterned SOI layer 12C. The resultant structure including the dielectric liner 20 is shown in FIG. 2. The dielectric liner 20 is comprised of a dielectric material such as an oxide, nitride, or oxynitride, with nitride-containing dielectrics such as silicon nitride being highly preferred. Typically, the dielectric liner 20 is a different dielectric than either the dielectric of the buried insulating layer 12B or the dielectric of an isolation region in which the material stack 14 can be located thereon.

The dielectric liner 20 is formed utilizing any conventional deposition process including, for example, chemical vapor deposition (CVD), plasma enhanced chemical vapor deposition (PECVD), evaporation and chemical solution deposition. The thickness of the dielectric liner 20 may vary depending on the deposition technique used in forming the same as well the exact material of the dielectric liner 20. Typically, the thickness of the dielectric liner 20 is from about 35 to about 60 nm.

Figure 3A:
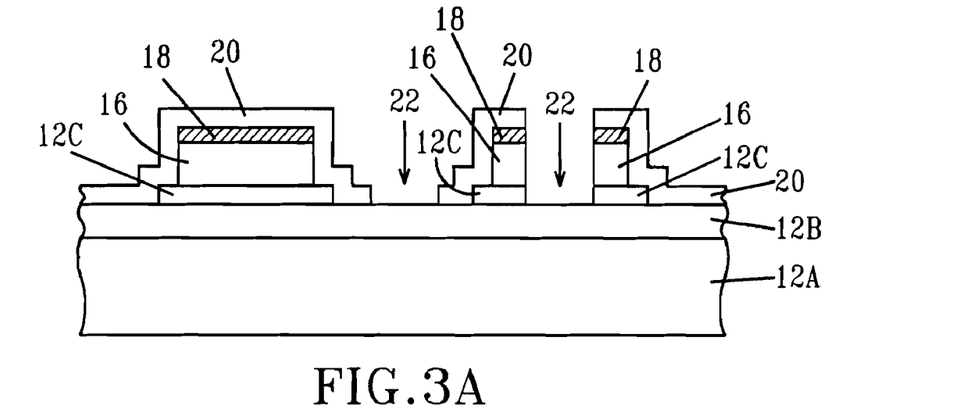
Figure 3B:
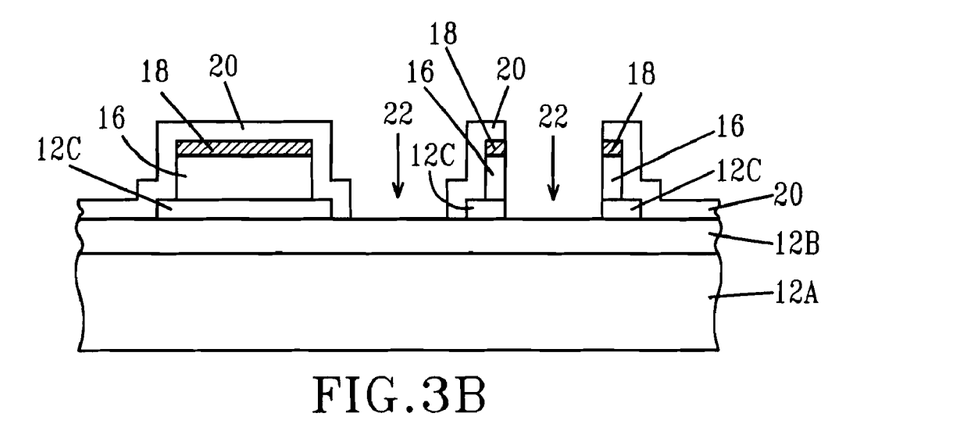
Figure 3C:
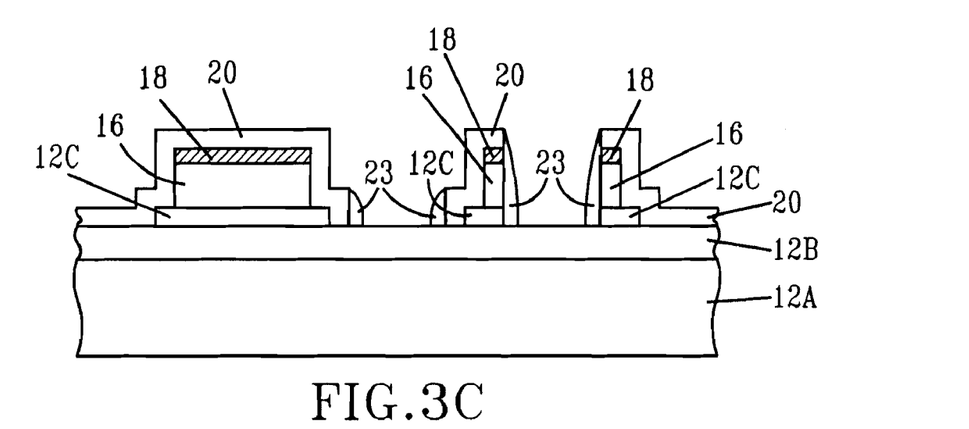

Next, and as shown in FIG. 3A, at least one interlayer via opening 22 is formed in dielectric liner 20. In accordance with the present invention, the at least one via opening 22 extends below the surface of the semiconductor substrate 12 using the patterned dielectric liner 20 as an etch mask and the buried insulating layer 12B of the SOI substrate as an etch stop layer. In embodiments in which the material stack is formed over a trench isolation region, the trench isolation region serves as the buried insulating layer in the structure. Typically, the at least one interlayer via opening 22 has an aspect ratio of greater than 3:1. This is shown in FIG. 3A. FIG. 3B illustrates an embodiment of the present invention in which the aspect ratio of the at least one interlayer via opening is about 3:1 or less. In such an embodiment, a spacer 23 as shown in FIG. 3C is used to reduce the width of the at least one interlayer via opening 22 to a value that is greater than 3:1. Moreover, the spacer 23 provides isolation (both electrical and physical) of the interlayer via openings.

The at least one interlayer via opening 22 is formed by first applying a photoresist (not shown) to the surface of the dielectric liner 20. The photoresist comprises any conventional photoresist material and any conventional deposition process such as, for example, CVD, PECVD, evaporation and spin-on coating, can be used in forming the same. After applying the photoresist, the photoresist is subjected to a pattern of radiation, and developed utilizing a conventional resist developer. The pattern of radiation has the form of the desired at least one interlayer via opening.

After these steps, the pattern is transferred from the exposed and developed photoresist to the dielectric liner 20 by utilizing a dry etching or chemical wet etching process. Typically, a dry etching process such as reaction ion etching (RIE), plasma etching or ion bean etching is employed.

Etching is continued typically through at least one material stack 14 and the patterned SOI layer 12C stopping on a surface of the buried insulating layer 12B using the etched dielectric liner 20 as an etch mask and the buried insulating layer 12B as an etch stop layer. The photoresist is then stripped utilizing a conventional stripping technique well known to those skilled in the art. The at least one interlayer via opening 22 can be formed between neighboring material stacks and/or vertically through the at least one material stack 14 and said patterned SOI layer 12C. In embodiments in which etching is conducted through the material stack 14, a wet chemical etch such as DHF is used in removing any metal semiconductor alloy residue. A piranha etch is then used to remove organic residue from the surface of the patterned dielectric liner 20.

Notwithstanding the type of interlayer via openings formed, the interlayer via openings are patterned using lithographic and a combination plasma or wet etch processes (as described above) which are specifically designed to transfer the lithographic pattern through the dielectric material 20 and/or layers 14 and 12C stopping on the buried insulating layer 12B in all cases.

In some embodiments as shown in FIGS. 3B and 3C, a spacer 23 is formed within the interlayer via opening 22 to reduce the dimension, i.e., width, of the interlayer via opening. In addition, the spacer provides physical and electrical isolation of the interlayer via openings to the surrounding material stacks. The spacer 23 is comprised of a conventional insulating material including, for example, an oxide, nitride, oxynitride or combinations thereof Typically, the spacer 23 is comprised of silicon oxide or silicon nitride. The spacer 23 is formed by deposition and anisotropic etching.

Figure 4:
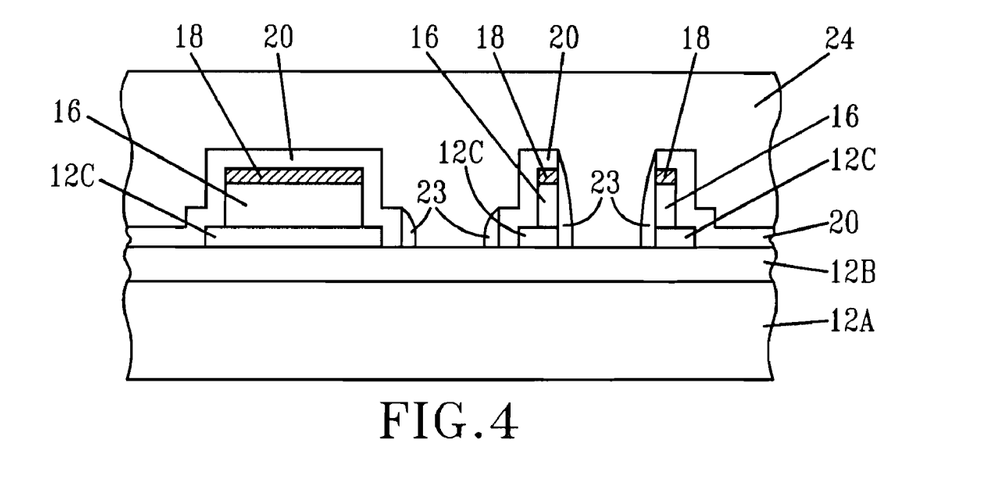

After providing at least one interlayer via opening 22 and optionally forming a spacer 23, a planarized dielectric material 24 which fills said at least one interlayer via opening 22 and extends above the at least one material stack 14 is formed by deposition. The resultant structure including the planarized dielectric 24 is shown, for example, in FIG. 4. FIG. 4 (and the remaining drawings) assumes the presence of the spacer 23. Typically, CVD or a high density plasma deposition process is used in forming the planarized dielectric material 24. In some instances, a CMP process can be used to planarize the dielectric material. The planarized dielectric material 24 comprises any MOL dielectric including, for example, a doped silicate glass or $SiO_2$.

Figure 5:
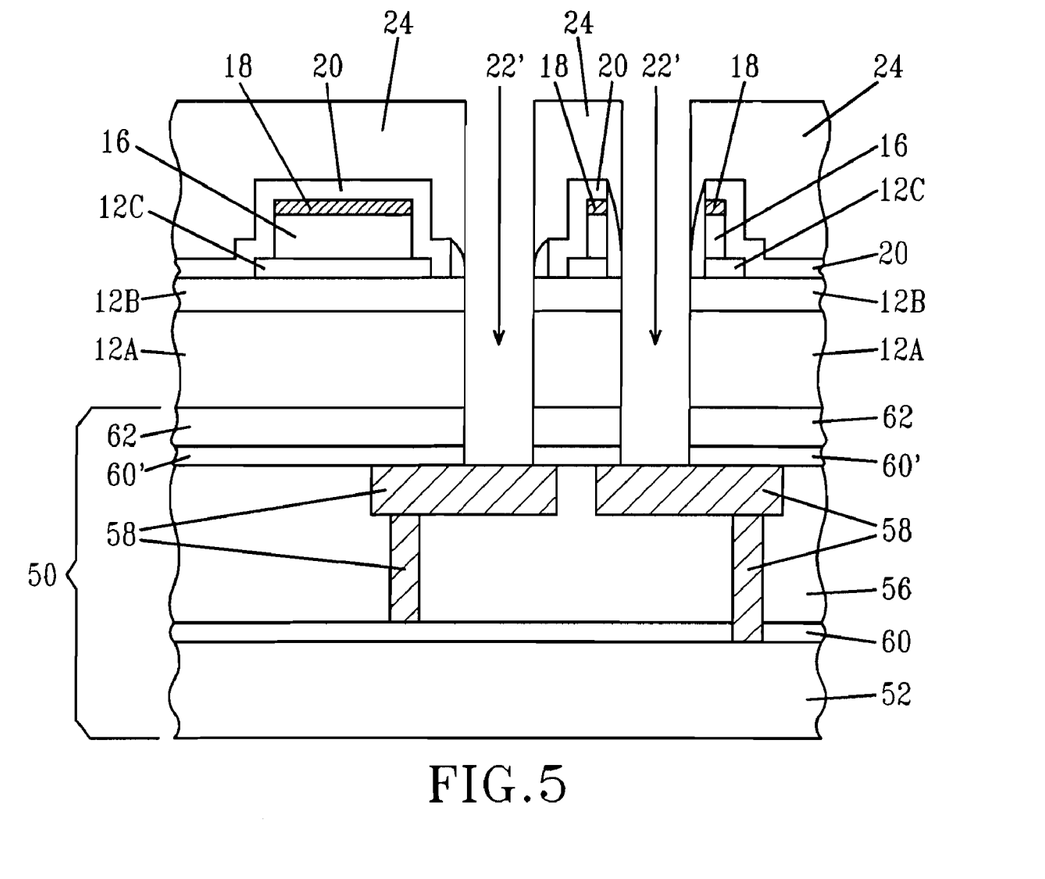
Figure 6:
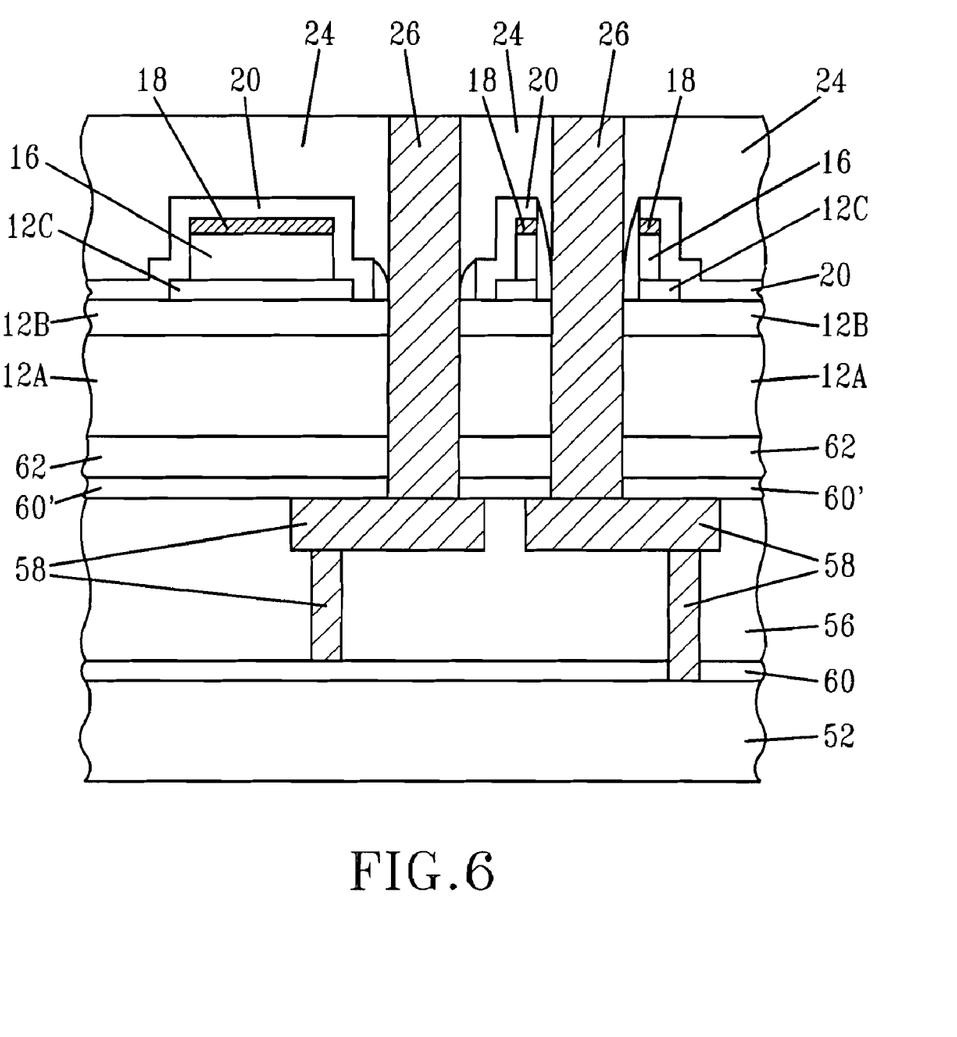

Next, and as shown in FIG. 5, a second structure 50 is bonded to a surface of the first structure 10 that is opposite a surface of the first structure including the material stack 14. The second structure 50 includes at least one semiconductor device (not specifically shown) which is located upon a surface of a semiconductor substrate 52. The semiconductor substrate 52 may be a bulk semiconductor or a semiconductor-on-insulator. The second structure 50 typically includes at least one interlayer dielectric 56 that contains at least one conductive feature 58 (via, line or a combination thereof) embedded within the dielectric 56. The at least one interlayer dielectric 56 and the conductive feature 58 are formed utilizing conventional interconnect processing techniques that are well known in the art. For the sake of clarity, the interconnect processing details have been omitted. The at least one interlayer dielectric 56 includes any dielectric material such as, for example, silicon oxide or an organosilicate. The conductor feature 58 is comprised of a conductive material such as, for example, Cu, Al or an Al—Cu alloy. The second structure 50 may optionally include a bonding layer 62 which may comprise a semiconductor material.

After processing the second structure 50, a conventional bonding process is used to bond the second structure 50 to the bulk semiconductor wafer 12A of the first structure 10. In some embodiments, the second structure may include barrier layers 60 and 60'. The barrier layers are formed utilizing a conventional deposition process and are composed of a material that prevents the outdiffusion of the conductive material into the dielectric material. Typically, the diffusion barriers include a nitride such as, for example, TiN, WN and/or TaN. It is noted that the conductive material defining the at least one feature embedded within the interlayer dielectric is spaced apart from the dielectric material by a diffusion barrier too.

Next, and as also shown in FIG. 5, selective etching of preselected areas of the planarized dielectric material 24 which are located above and within said at least one interlayer via opening 22 is performed to extend said at least one interlayer via opening 22 through the substrate 12. The etching stops on an upper surface of the second structure, typically, a surface of the embedded conductive feature 58. The selective etching at this point of the present invention typically goes through a single dielectric material. Typically, RIE (reactive ion etch) is used for this selective etching step that extends the at least one interlayer via opening 22 through the substrate 12. The extended interlayer via opening is labeled as 22' in FIG. 5. It is noted that the extended interlayer via openings 22' are self-aligned with the patterned dielectric liner 20 due to inherent selectivity of the RIE process to the dielectric liner 20 vs. the planarized dielectric material 24 and that they (i.e., the extended vias) have sidewalls that are substantially free of facets and have a high sidewall angle of greater than 87°. In some instances, the planarized dielectric 24 would be etched during the extension of the interlayer via opening and the inherent selectivity of the RIE process to the dielectric liner 20 and the spacer 23 would produce a self aligned interlayer via lined with spacer 23.

After extending at least one interlayer via opening entirely through the substrate 12, the extended via openings 22' are filled with a conductive material 26 such as an elemental metal, an alloy of an elemental metal or a metal silicide. Typically, the conductive material 26 comprises Cu, Al or an Al—Cu alloy. Any conventional deposition process can be used to filling the extended interlayer via openings 22' and, if needed, a planarization process can be used to remove conductive material that is located outside of the extended interlayer via openings.

The above processing steps can be used in forming multi-stacked structures each of which includes the extended interlayer via openings described above.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method for preparing a semiconductor structure comprising:
   providing a first structure including at least one material stack on a semiconductor substrate, said semiconductor substrate including at least a buried insulating layer;
   forming a dielectric liner covering said at least one material stack and said semiconductor substrate;
   forming at least one via opening in said first structure which extends below the surface of said semiconductor substrate using said dielectric liner as an etch mask, and said buried insulating layer as an etch stop layer;
   providing a planarized dielectric material which fills said at least one via opening and extends above said at least one material stack;
   bonding a second structure including at least one semiconductor device to a surface of said semiconductor substrate that is opposite a surface of said first structure including said at least one material stack;
   selectively etching preselected areas of said planarized dielectric material which are located above and within said at least one interlayer via opening to extend said at least one interlayer via opening stopping on an upper surface of said second structure; and
   filling said extended at least one interlayer via opening with a conductive material.

2. The method of claim 1 wherein said at least one material stack comprises, from bottom to top, polysilicon and a metal semiconductor alloy and is formed during a CMP fill process atop a patterned SOI layer of said SOI substrate.

3. The method of claim 1 wherein said forming at least one interlayer via opening comprises forming a patterned photoresist atop said dielectric liner, etching exposed surfaces of said dielectric liner to form said etch mask, and removing said patterned photoresist, said at least one interlayer via opening having an aspect ratio of greater than 3:1.

4. The method of claim 1 wherein said forming at least one interlayer via opening comprises forming a patterned photoresist atop said dielectric liner, etching exposed surfaces of said dielectric liner to form said etch mask, removing said patterned photoresist to provide said at least one interlayer via opening having an aspect ratio of greater than 3:1 and forming a spacer within said at least one interlayer via opening to reduce said aspect ratio.

5. The method of claim 1 wherein said selectively etch is self align to said etch mask.

6. The method of claim 1 wherein said at least one interlayer via opening vertically bisects said at least one material stack.

7. The method of claim 1 wherein said at least one interlayer via opening is located between neighboring material stacks.

8. A method for preparing a semiconductor structure comprising:
   providing a first structure including at least one material stack comprising, from bottom to top, polySi, and a metal silicide on a patterned SOI layer of a semiconductor-on-insulator (SOI) substrate;
   forming a silicon nitride liner covering said at least one material stack and said SOI substrate;
   forming at least one interlayer via opening in said first structure utilizing a buried oxide layer of said SOI substrate as an etch stop layer and said silicon nitride liner as an etch mask;
   providing a planarized dielectric material which fills said at least one interlayer via opening and extends above said at least one material stack;
   bonding a second structure including at least one semiconductor device to a surface a surface of said SOI substrate that is opposite a surface including said at least one material stack;
   selectively etching preselected areas of said planarized dielectric material which are located above and within said at least one interlayer via opening to extend said at least one interlayer via opening through said SO substrate stopping on an upper surface of said second structure; and
   filling said extended at least one interlayer via opening with a conductive material.

9. The method of claim 8 wherein said forming at least one interlayer via opening comprises forming a patterned photoresist atop said dielectric liner, etching exposed surfaces of said dielectric liner to form said etch mask, and removing said patterned photoresist, said at least one interlayer via opening having an aspect ratio of greater than 3:1.

10. The method of claim 8 wherein said forming at least one interlayer via opening comprises forming a patterned photoresist atop said dielectric liner, etching exposed surfaces of said dielectric liner to form said etch mask, removing said patterned photoresist to provide said at least one interlayer via opening having an aspect ratio of greater than 3:1 and forming a spacer within said at least one interlayer via opening to reduce said aspect ratio.

11. The method of claim 8 wherein said selectively etch is self align to said etch mask.

12. The method of claim 8 wherein said at least one interlayer via opening vertically bisects said at least one material stack.

13. The method of claim 8 wherein said at least one interlayer via opening is located between neighboring material stacks.

* * * * *